United States Patent [19]
Ochii

[11] Patent Number: 5,132,929
[45] Date of Patent: Jul. 21, 1992

[54] STATIC RAM INCLUDING LEAKAGE CURRENT DETECTOR

[75] Inventor: Kiyofumi Ochii, Yokohama, Japan

[73] Assignee: Kabushiki Kaisha Toshiba, Kawasaki, Japan

[21] Appl. No.: 288,183

[22] Filed: Dec. 22, 1988

[30] Foreign Application Priority Data

Dec. 23, 1987 [JP] Japan ................... 62-325689

[51] Int. Cl.$^5$ ............... G11C 29/00; G11C 11/419
[52] U.S. Cl. ................... 365/201; 365/154; 365/226
[58] Field of Search ............ 365/154, 156, 190, 201, 365/226, 227; 371/21.1, 21.4

[56] References Cited

U.S. PATENT DOCUMENTS

| | | | |
|---|---|---|---|
| 3,795,859 | 3/1974 | Benante | 371/21.4 |
| 4,004,222 | 1/1977 | Gebhard | 371/21.4 |
| 4,120,047 | 10/1978 | Varadi | 365/227 |
| 4,409,679 | 10/1983 | Kurafuji et al. | 365/227 |
| 4,685,086 | 8/1987 | Tran | 365/201 |
| 4,760,562 | 7/1988 | Ohtani | 365/227 |
| 4,835,458 | 5/1989 | Kim | 371/21.4 |

FOREIGN PATENT DOCUMENTS

| | | | |
|---|---|---|---|
| 0085993 | 5/1983 | Japan | 365/154 |
| 0211391 | 12/1983 | Japan | 365/154 |
| 0268189 | 11/1988 | Japan | 365/226 |
| 2159359 | 11/1985 | United Kingdom | 365/154 |

Primary Examiner—Glenn Gossage
Attorney, Agent, or Firm—Finnegan, Henderson, Farabow, Garrett and Dunner

[57] ABSTRACT

A static random access memory has a plurality of memory cells. Each memory cell is made up of two high-resistance resistors functioning as load elements, and a flip-flop circuit. The flip-flop circuit is made up of two inverters including MOS transistors which are formed in a substrate and used as drive elements. The sources of the two MOS transistors are coupled to each other and electrically isolated from the substrate. Another MOS transistor is connected between the common source of the flip-flop MOS transistors and the source of a power-supply voltage. A MOS transistor is coupled between the common source of the MOS transistors and the source of a ground voltage. A plurality of bit lines supplies data to, and receives data from, the memory cells. A resistance element is connected between each bit line and the source of the power-supply voltage, and an output terminal outputs the voltage at one end of this resistance element. Two different voltages are applied to the sources of the two MOS transistors. One voltage is applied during normal operation of the memory and the other voltage is applied during leakage current detection testing.

4 Claims, 6 Drawing Sheets

FIG. 1
PRIOR ART

| MEMORY CAPACITY | 256K | 1M | 4M | 16M |
|---|---|---|---|---|
| RESISTANCE | 1 TERA Ω | 4 TERA Ω | 16 TERA Ω | 64 TERA Ω |

STATIC RAM INCLUDING LEAKAGE CURRENT DETECTOR

BACKGROUND OF THE INVENTION

1. Field of the Invention

The present invention relates to a static random access memory having high-resistance elements made of polycrystalline silicon used as load elements within memory cells, and more particularly, to a static random access memory provided with a means for detecting any defective memory cells having leakage current.

2. Description of the Related Art

An E/R (Enhancement type MOS transistor/resistor) type static random-access memory cell (E/R type SRAM cell) is known. As is understood from the equivalent circuit diagram shown in FIG. 1, this memory cell comprises a flip-flop circuit. The flip-flop circuit is comprised of two inverters, each having one high-resistance element, which is used as a load element, and one enhancement type metal oxide semiconductor (MOS) MOS transistor which functions as a drive element. The input and output of the first inverter are connected to the output and input of the second inverter, respectively. More specifically, high-resistance elements R1 and R2 are coupled, at one end, to power-supply voltage $V_{CC}$, and at the other end, to the drains of MOS transistors Q1 and Q2, respectively. The sources of MOS transistors Q1 and Q2 are connected to a ground voltage VSS. The gate of transistor Q1 is connected to the drain of transistor Q2, and the gate of transistor Q2 is connected to the drain of transistor Q1. Hence, high-resistance elements R1 and MOS transistor Q1 form an inverter, and high-resistance element R2 and MOS transistor Q2 form another inverter. These inverters have their input and output connected to each other's output and input, respectively, whereby the inverters constitute flip-flop circuit F.

Figure 1:
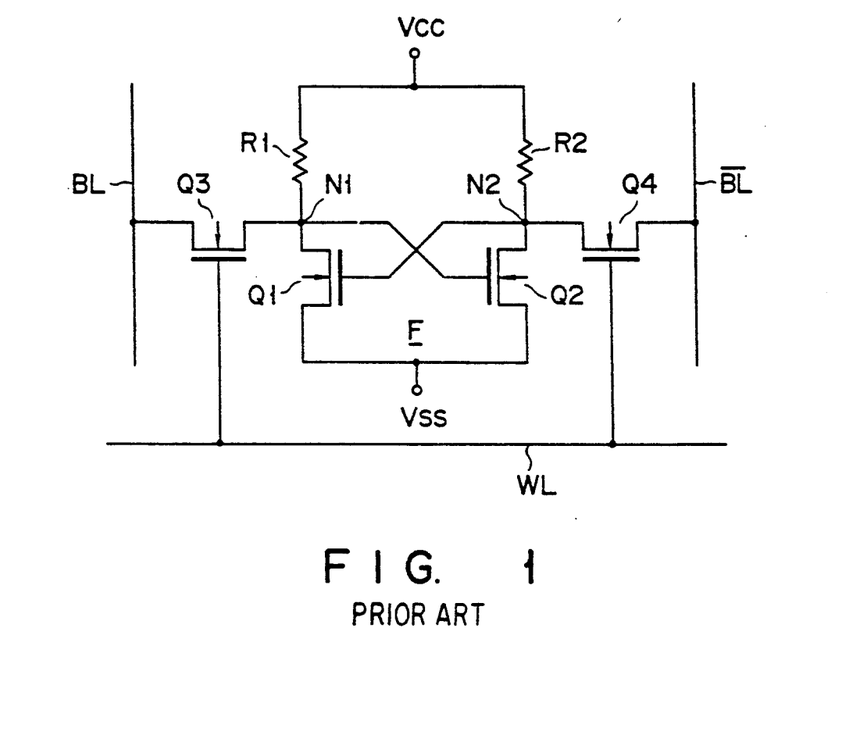
FIG. 1 is an equivalent circuit diagram showing an E/R-type SRAM cell.

As is illustrated in FIG. 1, MOS transistors Q3 and Q4 are used as transfer gates for controlling data-writing and data-reading. MOS transistor Q3 is connected between memory node N1 of flip-flop circuit F and bit line BL. MOS transistor Q4 is connected between memory node N2 of flip-flop circuit F and bit line $\overline{BL}$. The gates of both MOS transistors Q3 and Q4 are connected to word line WL. All transistors Q1 to Q4 are of enhancement type.

The flip-flop circuit F, which is the main component of the memory cell, is a bistable flip-flop. Therefore, two data items which are complementary to each other are stored in memory nodes N1 and N2. Assuming that data items, i.e., "1" and "0", are stored in nodes N1 and N2, respectively, transistor Q1 is off, and transistor Q2 is on. Since high-resistance elements R1 and R2 are linear passive elements, a current flows through high-resistance element R2 coupled to transistor Q2 which is on. The resistance of high-resistance element R2 is far higher than the on-resistance of transistor Q2. Hence, the resistance of element R2 determines the amount of current flowing through transistor Q2. A similar current flows in each of the E/R type SRAM cells forming a static random access memory (SRAM), and the sum of the currents flowing through all E/R type SRAM cells determines the current consumed by the SRAM in its static condition.

Also well known are completely CMOS SRAM cells, each comprising six transistors, two of which are P-channel MOS transistors functioning as load elements. Since the load elements of each completely CMOS RAM cell are active elements, the current which flows in this cell in the static condition is only a leakage current. The current flowing through this cell when the cell is in the static condition is, therefore, small. In contrast, a relatively large current flows through the E/R type SRAM cell when the cell is in the static condition. To reduce this current, high-resistance elements R1 and R2 are replaced with resistors of higher resistances. However, when elements R1 and R2 are replaced by such resistors, the flip-flop F may operate unstably, inevitably destroying the data stored in the E/R type SRAM cell, as will be explained below.

Figure 2:
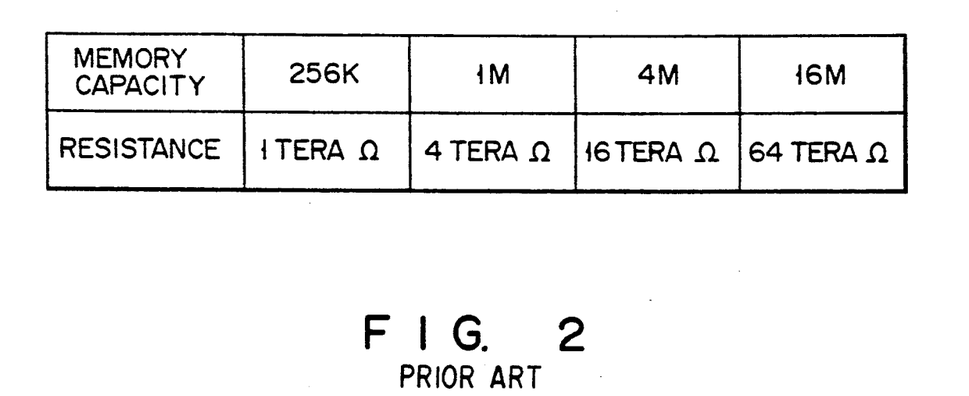
FIG. 2 is a table showing the relationship between the memory capacity of an E/R-type SRAM and the resistance of the high-resistance elements used in each memory cell of the E/R-type SRAM.

FIG. 2 is a table showing the various resistances which high-resistance elements R1 and R2 of each E/R type SRAM cell must have to maintain the current, which flows through the cell in the static condition, at the typical value of 1 $\mu$A, in accordance with the memory capacity of the E/R type SRAM. As may be understood from FIG. 1, memory nodes N1 and N2 exist in the PN junction between a P-type substrate and an N+ diffusion region which is the common source of transistors Q1 and Q2. The reverse leakage current flowing in this PN junction is about $10^{-14}$ A. This value is equivalent to a resistance of about 100 tera $\Omega$. In the case of a 256 K-bit memory, the resistance of either high-resistance element, R1 or R2, is 100 times the resistance equivalent to the reverse leakage current flowing in the PN junction. In the case of a 1M-bit memory, the resistance is 25 times the resistance equivalent to the reverse leakage current. The greater the ratio of the resistance of either high-resistance element, the larger the operation margin of each memory cell. As is evident from FIG. 2, this operation margin is inversely proportional to the capacity of the memory.

What has been explained in the preceding paragraph only applies to the case where no abnormal leakage currents flow in the PN junction connected to both memory nodes N1 and N2. In actuality, both a defective leakage current and a contaminating leakage current are generated in the PN junction. When these abnormal leakage currents are far greater than the currents flowing through high-resistance elements R1 and R2, neither memory node can hold the data item "1", and the flip-flop circuit F ceases to function. Hence, the E/R type SRAM cell having this flip-flop circuit F cannot perform its function. Any SRAM chip, including such a defective memory cell, can no longer function at all.

On the hand, when the abnormal leakage currents are nearly equal to the currents flowing through high-resistance elements R1 and R2, the voltage applied on the memory node storing the data item "1" falls to the value determined by the division of resistance achieved by high-resistance elements R1 and R2 and also by the resistance equivalent to the abnormal leakage current. Consequently, flip-flop circuit F becomes very unstable, and the memory cell, as a whole, inevitably operates unstably. Any SRAM which includes such a defective memory cell has neither a sufficient margin for power-supply voltage nor a sufficient margin for temperature changes. Unless the defective memory cell is detected, and appropriate measures are taken for the cell, the data will be destroyed eventually.

However, it is extremely difficult to detect a defective memory in the SRAM. As is known in the art, it takes a long period of time to complete the test for screening an inadequate operation margin or for a defect. In some cases, it is necessary to set the ambient temperature at various values to carry out this test successfully. In the worst case, the insufficient operation margin or the defect may not be detected even if the test has been effected for a considerably long time.

Figure 3:
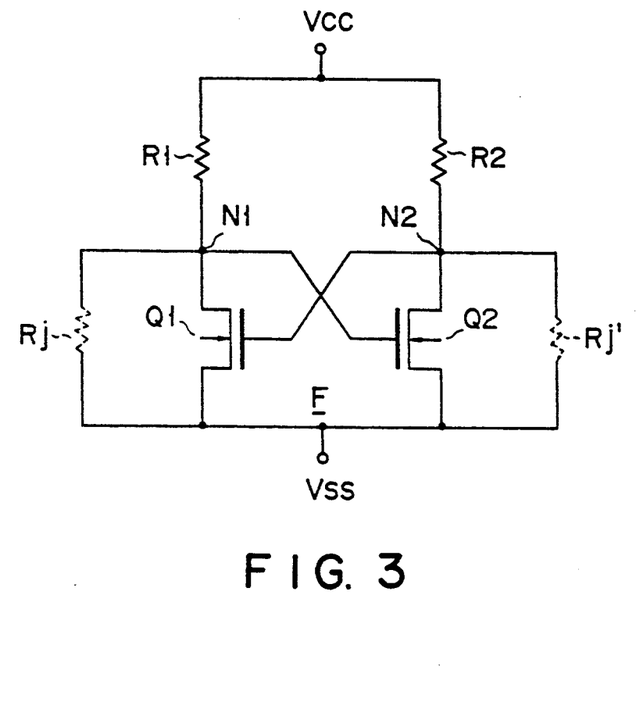
FIG. 3 is an equivalent circuit diagram showing part of the E/R-type SRAM cell illustrated in FIG. 1.

FIG. 3 is an equivalent circuit diagram showing the flip-flop circuit of an E/R type SRAM cell which is identical to the SRAM cell shown in FIG. 1, except that memory nodes N1 and N2 each have a leakage-current path which are shown for illustrative purposes. Resistors Rj and Rj' shown in FIG. 3 are equivalently present on leakage-current paths. More precisely, resistance Rj exists only when a reverse junction coupled to memory node N1, whereas resistance Rj' exists only when a leakage current of an abnormal value flows through the PN junction connected to memory node N2.

Figure 4:
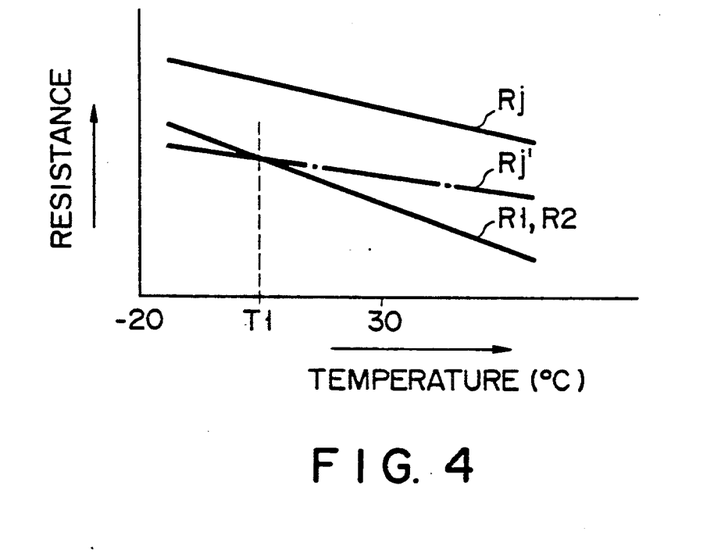
FIG. 4 is a diagram representing the temperature characteristics of the various resistors incorporated in the E/R-type SRAM cell shown in FIG. 1.

The typical temperature characteristics of resistors R1, R2, Rj, and Rj' are illustrated in FIG. 4. As can be understood from FIG. 4, the temperature dependence on the resistivity of high-resistance elements R1 and R2, each formed of a polycrystalline silicon layer, is great. The resistance of resistor Rj is determined by the junction area of memory node N1, and is about 100 tera $\Omega$. The temperature dependency of resistor Rj is less than that of high-resistance elements R1 and R2. Resistor Rj' has a lower resistance than resistor Rj because of the loss of resistance equivalent to the abnormal leakage current flowing through the PN junction. As is evident from FIG. 4, the line representing the temperature characteristic of resistor Rj' crosses the line representing the temperature characteristic of resistors R1 and R2 at a specific temperature T1 if the resistance of resistor Rj' is about hundreds of times lower than that of resistor Rj. The specific temperature T1 falls within the range in which the memory cell can correctly perform its function. In other words, resistor Rj' has the same resistance as elements R1 and R2 at temperature T1. The resistor Rj' has a resistance lower than that of high-resistance elements R1 and R2 at any temperature below T1, and a resistance higher than that of elements R1 and R2 at any temperature above T1.

The voltage at which memory nodes N1 and N2 hold data when the memory cell is in its static condition will now be calculated. The voltage V1(1) which node N1 requires to hold data "1" can be given:

$$V1(1) = \left\{ \left( \frac{Rj \cdot Rn(\text{off})}{Rj + Rn(\text{off})} \right) \Big/ \left( \frac{Rj \cdot Rn(\text{off})}{Rj + Rn(\text{off})} + R1 \right) \right\} \cdot V_{CC} \quad (1)$$

The voltage V2(1) which node N2 requires to hold data "1" can be given:

$$V2(1) = \left\{ \left( \frac{Rj' \cdot Rn(\text{off})}{Rj' + Rn(\text{off})} \right) \Big/ \left( \frac{Rj' \cdot Rn(\text{off})}{Rj' + Rn(\text{off})} + R2 \right) \right\} \cdot V_{CC} \quad (2)$$

The voltage V1(0) which node N1 requires to hold data "0" can be given:

$$V1(0) = \left\{ \left( \frac{Rj \cdot Rn(\text{on})}{Rj + Rn(\text{on})} \right) \Big/ \left( \frac{Rj \cdot Rn(\text{on})}{Rj + Rn(\text{on})} + R1 \right) \right\} \cdot V_{CC} \quad (3)$$

The voltage V2(0) which node N2 requires to hold data "0" can be given:

$$V2(0) = \left\{ \left( \frac{Rj' \cdot Rn(\text{on})}{Rj' + Rn(\text{on})} \right) \Big/ \left( \frac{Rj' \cdot Rn(\text{on})}{Rj' + Rn(\text{on})} + R2 \right) \right\} \cdot V_{CC} \quad (4)$$

In the above equations (1) to (4), Rn(off) is the resistance equivalent to the channel leakage current which flows when transistors Q1 and Q2 of flip-flop circuit F are off, and Rn(on) is the resistance equivalent to the channel current which flows when transistors Q1 and Q2 are on. Any transistor has Rn(off) as high as $10^{14}$ $\Omega$ or more if operating correctly. Hence, equations (1) to (4) can reduce to:

$$V1(1) \approx V_{CC} \quad (5)$$

$$V2(1) \approx \frac{Rj'}{Rj' + R2} \cdot V_{CC} \quad (6)$$

$$V1(0) \approx V2(0) \approx 0 \quad (7)$$

It is desirable that the voltages which each memory cell requires to store data "1" and data "0" be $V_{CC}$ and 0V, respectively. Voltage V2(1), at which memory node N2 holds data "1", is determined by Rj'/R2+Rj', and is lower than $V_{CC}$. The lower Rj' is than R2, the more voltage V2(1) will fall. When votage V2(1) falls below the threshold voltage Vthn of each N-channel MOS transistor, Rn(on), one of the terms of equation (3), changes to Rn(off). Consequently, voltage V1(0), at which memory node N1 holds data "0", will rise to $V_{CC}$ with time constant of R1.CA (where CA is the capacitance present in memory node N1). That is, data "0" held by node N1 has changed to "1", whereas data "1" held by node N2 has changed to "0". This is the destruction of data. In terms of the temperature characteristics shown in FIG. 4, the data is destroyed at temperature T1 or any lower temperature. This destruction of data is, hence, called "leakage induced cell destruction at low-temperature."

A SRAM memory cell which has undergone low-temperature pause destruction (the destruction of data in a pause mode) cannot be detected unless the SRAM chip is tested not only at room temperature, but also at other various temperatures. It takes an extremely long time to test the SRAM chip at various temperatures, for a memory cell, if any, which has undergone leakage induced cell destruction at low-temperature. Obviously, it is uneconomical to spend much time on testing each SRAM chip. Further, a SRAM cell repeats unstable operation several times until the data stored in it is destroyed completely. This unstable operation of the cell is very hard to detect within a short time of period. It is required to easily and reliably test a wafer having a number of SRAM chips, to determine quickly whether or not each SRAM chip contains any defective memory cells.

Hitherto, in order to detect defective memory cells, if any, contained in a SRAM chip, the operation characteristics of all cells of the SRAM chip are externally examined. This method cannot be completely successful and requires a very long time to test the SRAM chip.

SUMMARY OF THE INVENTION

It is the object of the present invention to provide a static random access memory which has a means capable of detecting a leakage current, and which easily detects any defective memory cells.

According to the invention, there is provided a static random access memory comprising: a plurality of memory cells each having a flip-flop circuit comprising two inventors each including a resistor functioning as a load element and a MOS transistor which is formed in a substrate and used as a drive element and whose source is coupled to the source of the MOS transistor of the other inventor and sources of the MOS transistors are electrically isolated from the substrate; a plurality of word lines for selecting the memory cells; a plurality of bit lines for supplying data to, and receiving data from, the memory cells; voltage-applying means for applying different voltages to the sources of the MOS transistors of each memory cell; and current-detecting means for detecting a leak current flowing in each memory cell.

DETAILED DESCRIPTION OF THE PREFERRED EMBODIMENTS

Figure 5:
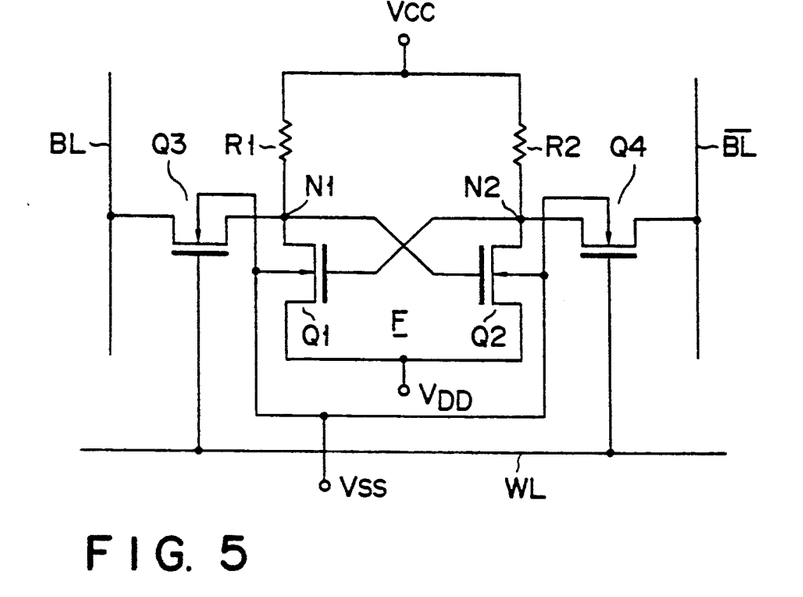
FIG. 5 is a circuit diagram showing each memory cell of the memory according to a first embodiment of the present invention.

Before a few embodiments of the invention are described, the principle of the present invention will be explained. FIG. 5 shows one of the memory cells forming the cell array incorporated in a static random access memory according to the present invention. This memory cell comprises four MOS transistors Q1 to Q4 and two high-resistance resistors R1 and R2, like each memory cell of the conventional E/R-type SRAM which is shown in FIG. 1. The substrate in which these MOS transistors Q1 to Q4 are formed, a so-called back gate, is connected to a ground-voltage source $V_{SS}$. The sources of MOS transistors Q1 and Q2 are coupled to a voltage source $V_{DD}$ provided independently of the voltage source $V_{SS}$. To test the memory cell, the power-supply voltage $V_{CC}$ is applied as voltage $V_{DD}$ to the memory cell. At all other times, the ground voltage VSS is applied as voltage $V_{DD}$ to the memory cell. This method of applying the voltage $V_{SS}$ to the cell is accomplished by connecting two bonding pads by means of bonding wires after the memory cell has been tested.

Figure 6:
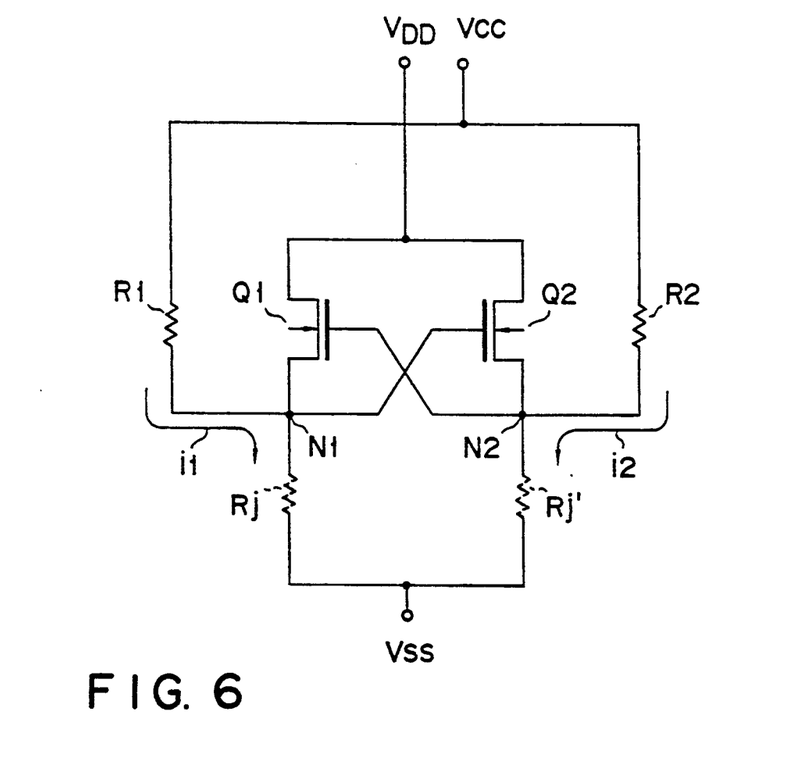
FIG. 6 is an equivalent circuit diagram showing a part of the memory cell illustrated in FIG. 5.

FIG. 6 is an equivalent circuit diagram showing a part of the memory cell illustrated in FIG. 5. More precisely, FIG. 6 illustrates the flip-flop circuit F wherein a normal reverse leakage current of the PN junction flows in memory node N1, and a reverse leakage current containing an abnormal component flows in memory node N2.

The voltage $V_{CC}$, i.e., the highest voltage that is applied to the memory cell, is applied to the memory cell as the voltage $V_{DD}$ in order to test the cell. Then, both memory nodes N1 and N2 are set at the voltage $V_{CC}$, and the gate voltage and source voltage of either transistor (Q1 or Q2) are set at the same voltage. (In this case, that end of either transistor which is coupled to the memory node (N1 or N2) functions as a source of the transistor). Therefore, both transistors Q1 and Q2 are off at all times in any case. The equivalent resistance Rn(off), which is determined by the channel leakage current while transistors Q1 and Q2 are off, is as high as $10^{14}$ Ω or more. In this case, there are two current paths. The first path consists of high resistance resistor R1 and equivalent resistor Rj, and the second path consists of high-resistance resistor R2 and equivalent resistor Rj'. Current i1 flows through the first path, and current i2 flows through the second path. When currents i1 and i2 flow through these two current paths, respectively, a current flows from the source of voltage $V_{CC}$ to the source of voltage $V_{SS}$, regardless of the data-holding characteristic of the flip-flop circuit F.

Currents i1 and i2 are given as:

$$i1 = \frac{V_{CC}}{Rj + R1} \simeq \frac{V_{CC}}{Rj} \quad (8)$$

$$i2 = \frac{V_{CC}}{Rj + R2} \simeq \frac{V_{CC}}{R2} \quad (9)$$

where Rj<R2 and R1>Rj.

Assuming that Rj=$10^{14}$Ω, R1=R2=$10^{12}$ Ω, and Rj'<$10^{12}$ Ω, i2 is hundreds times greater than i1. The value of current i2 is proportional to the probability that the memory cell has undergone leakage induced cell destruction at low-temperature. In other words, when i2 is greater than i1, an abnormal leakage-current component exists in memory node N2. This means that the memory cell has undergone leakage induced cell destruction at low-temperature and is thus defective. Therefore, the value of the current leaking from the source of the voltage $V_{CC}$ determines whether or not the memory cell is reliable.

Here arises a problem. The value of current i2 is limited due to high-resistance resistor R2. It is no more than about $10^{-12}$ A even when a considerably leakage current flows through the memory cell. This extremely small leakage current must be detected to determine that the memory cell is defective. In practice, it is difficult to detect such an infinitesimal current. Actually, what can be detected is nothing but the sum of the leakage currents flowing through all memory cells of the SRAM. Obviously, it is next to impossible to find a diffeeence between the sum of the leakage currents of flawless memory cells and the sum of the leakage currents of as many memory cells including a few defective ones.

Some IC memories according to the present invention, which have a means capable of detecting the leakage current flowing through each memory cell, will be described with reference to FIGS. 7, 8, 9A, and 9B.

Figure 7:
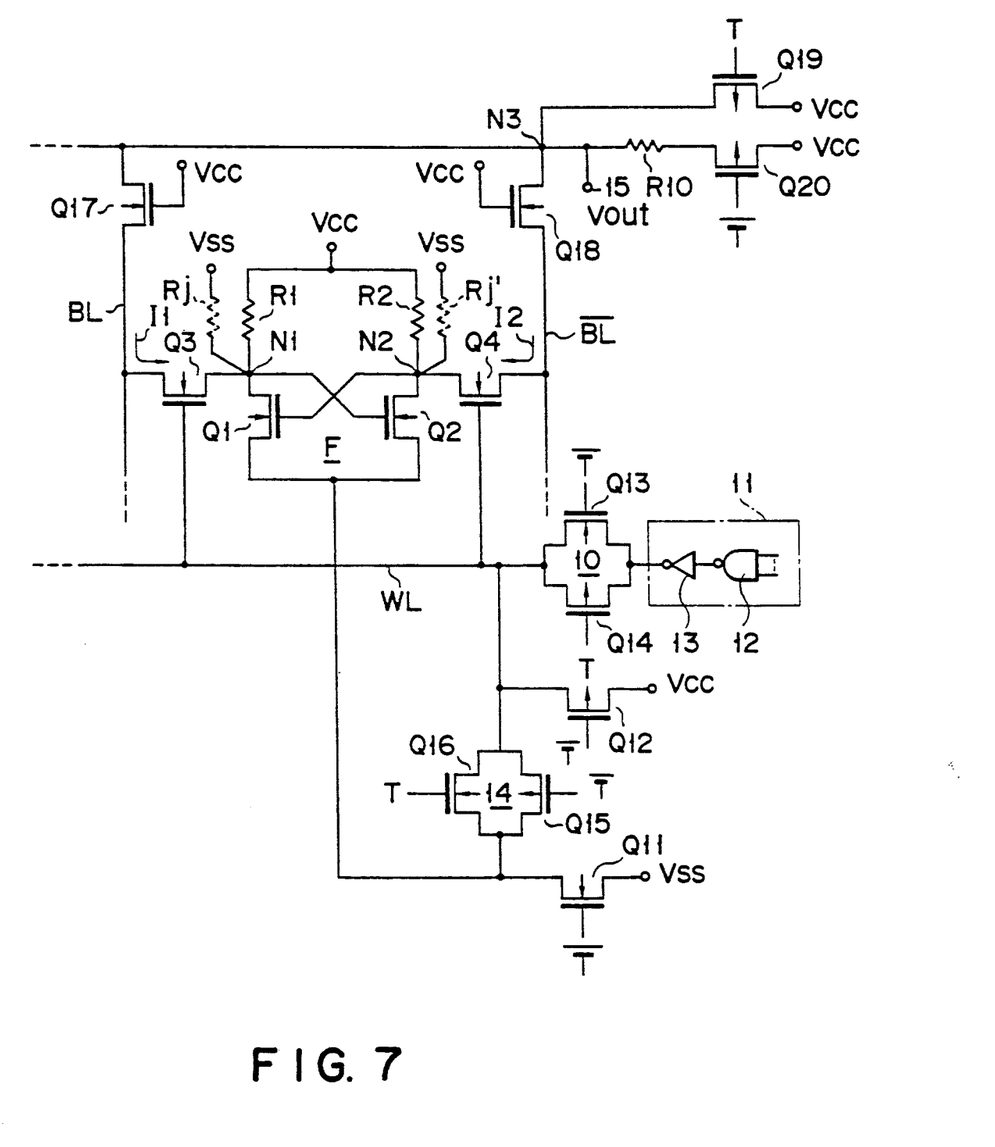
FIG. 7 is a circuit diagram illustrating the structure of the first embodiment of this invention.

FIG. 7 is a circuit diagram illustrating the structure of the first embodiment of this invention, i.e., a static random access memory. The same elements as those shown in FIG. 4 are denoted at the same reference numerals in FIG. 7, and will not be described in detail. Although this memory has a number of memory cells and a number of bit-line pairs, each consisting of bit lines BL and $\overline{BL}$, only one cell and only one bit-line pair are illustrated in FIG. 7 for the sake of simplicity. Actually, many memory cells are connected between bit lines BL and $\overline{BL}$ forming each pair.

In each memory cell of this memory, equivalent resistors Rj and Rj' are connected to memory nodes N1 and N2, respectively, as in the memory cell shown in FIG. 6. The common source of transistors Q1 and Q2, which form the memory cell, are connected to the source of the ground voltage $V_{SS}$ by N-channel MOS transistor Q11. The gate of MOS transistor Q11 is connected to receive a control signal $\overline{T}$ which is at the "0" level to test the memory cell. A word line WL is connected to the source of the power-supply voltage $V_{CC}$ by P-channel MOS transistor Q12. The gate of MOS transistor Q12 is coupled to receive the control signal $\overline{T}$. The output of partial row decoder 11 is connected to word line WL by CMOS transmission gate 10. CMOS transmission gate 10 is comprised of N-channel MOS transistor Q13 and P-channel transistor Q14 connected in parallel, and is turned on and off by control signals $\overline{T}$ and T. Partial row decoder 11 consists of NAND gate 12 for receiving a plurality of address signals, and inverter 13 for inverting the signal output by NAND gate 12. Further, CMOS transmission gate 14 is coupled between the word line WL and the common source of transistors Q1 and Q2. This transmission gate 14 is comprised of P-channel MOS transistor Q15 and N-channel transistor Q16 coupled in parallel, and the transmission gate 14 is turned on and off by control signals $\overline{T}$ and T.

Two N-channel MOS transistors Q17 and Q18, either of which may be used as a bit-line load, are provided. Transistor Q17 is coupled between node N3 and bit line BL, and transistor Q18 is coupled between node N3 and bit line $\overline{BL}$. The gates of these transistors Q17 and Q18 are connected to the source of the power-supply voltage $V_{CC}$, and the transistors Q17 and Q18 are on at all times. P-channel MOS transistor Q19 is coupled between node N3 and the source of the power-supply voltage $V_{CC}$. The gate of this transistor Q19 is connected to receive the control signal T. A series circuit comprised of resistor R10 and P-channel MOS transistor Q20 is connected between node N3 and the source of the power-supply voltage $V_{CC}$. The gate of MOS transistor Q20 is coupled to receive the control signal $\overline{T}$. A voltage-output terminal 15 is connected to that end of resistor R10 which is coupled to node N3.

In order to test the memory cell to determine whether or not each cell has undergone leakage induced cell destruction at low-temperature, the control signals T and $\overline{T}$ are set at the "1" level and the "0" level, respectively. Hence, transistor Q11 is turned off, and transistor Q12 is turned on. As a result of this, CMOS transmission gate 10 goes off, whereas CMOS transmission gate 14 is rendered on. Therefore, the potential of word line WL is set to the power-supply voltage $V_{CC}$, i.e., the "1" level, through transistor Q12, irrespective of the data output by partial row decoder 11. The potential of the common source of transistors Q1 and Q2 is also set to the "1" level through transistor Q12 and CMOS transmission gate 14. That is, in each memory cell, the word line WL and the common source of transistors Q1 and Q2 are set to the potential at the "1" level.

While each memory cell is being tested, transistor Q20 is on, and the power-supply voltage $V_{CC}$ is applied to node N3 through resistor R10.

Since the common source of transistors Q1 and Q2 has been set to the potential at the "1" level, transistors Q1 and Q2 are off in any case. Since the word line WL has been set to the potential at the "1" level, transistors Q3 and Q4 are on. Hence, currents I1 and I2 flow from bit lines BL and $\overline{BL}$ through transistors Q3 and Q4 to flip-flop circuit F, as is indicated by the arrows in FIG. 7. Because of the currents I1 and I2, the voltage drops across resistor R10. The voltage Vout applied from terminal 15 at this moment is given as follows:

$$V_{out} = V_{CC} - R(I1 + I2) \qquad (10)$$

where R is the resistance of resistor R10.

A substrate bias effect is applied to transistors Q3 and Q4, and the currents I1 and I2 can start flowing through transistors Q3 and Q4 when the potential at memory nodes N1 and N2 falls below a predetermined voltage. In fact, however, current I1 does not flow through transistor Q3 since Rj>>R1, and the voltage at memory node N1 is sufficiently similar to the voltage $V_{CC}$. Current I2 flows through transistor Q4 when Rj'≦R2, and the voltage at memory node N2 falls below the powersupply voltage $V_{CC}$. More precisely, current I2 starts flowing through transistor Q4 when the voltage at node N2 falls below a predetermined value which is lower than the power-supply voltage $V_{CC}$. In other words, a current flows through resistor R10 only when an abnormal leakage current flows through memory node N2, thus causing a voltage drop across resistor RIO. If the voltage Vout applied from terminal 15 at this time is lower than the voltage $V_{CC}$ by a specific value, it is determined that at least one of the memory cells has undergone low-temperature pause destruction. Assuming that equivalent resistance Rj' is $10^{12}$ Ω, and the resistance of resistor R10 is also $10^{12}$ Ω, the voltage Vout is $$V_{CC} \times \frac{Rj'}{R10 + Rj'},$$

and is thus $\frac{1}{2} \cdot V_{CC}$ in case where only one memory cell has undergone leakage induced cell destruction at low-temperature. Obviously, the voltage Vout is inversely proportional to the number of defective cells. When the voltage Vout than $\frac{1}{2} \cdot V_{CC}$ (one-half of $V_{CC}$), it is determined that one or more memory cells have undergone leakage induced cell destruction at low-temperature. Therefore, it is easy to detect such defective memory cells. Any memory having at least one defective memory cell is thrown away as being unreliable.

In any memory, which has been found, by the tests, to be free of defective cells, control signals T and $\overline{T}$ are set to the "0" level and the "1" level, respectively. As a result of this, transistor Q11 is turned on, and the common source of transistors Q1 and Q2 is coupled to the source of the ground voltage $V_{SS}$. CMOS transmission gate 10 is turned on, whereby the output of partial row decoder 11 is supplied to the word line WL. Further, transistor Q20 is turned off, and resistor R10 is therefore disconnected from source of the power-supplying voltage $V_{CC}$. Transistor Q19 is turned on, and node N3 is therefore connected to the source of the power-supply voltage $V_{CC}$. Hence, data can now be written into, or read from, the memory cell.

The control signals T and $\overline{T}$ can be externally supplied. If this is the case, the memory will require more terminals than otherwise, and the memory chip will inevitably be large. It is desirable that the memory chip be as small as possible. To this end, both control signals T and $\overline{T}$ must be changed within the chip. Memory means such a fuse can be provided within the memory, and can be cut either by supplying a current to the fuse or by applying an energy beam to the fuse, thereby to change the levels of the signals T and $\overline{T}$ to the "0" level and the "1" level, respectively.

Figure 8:
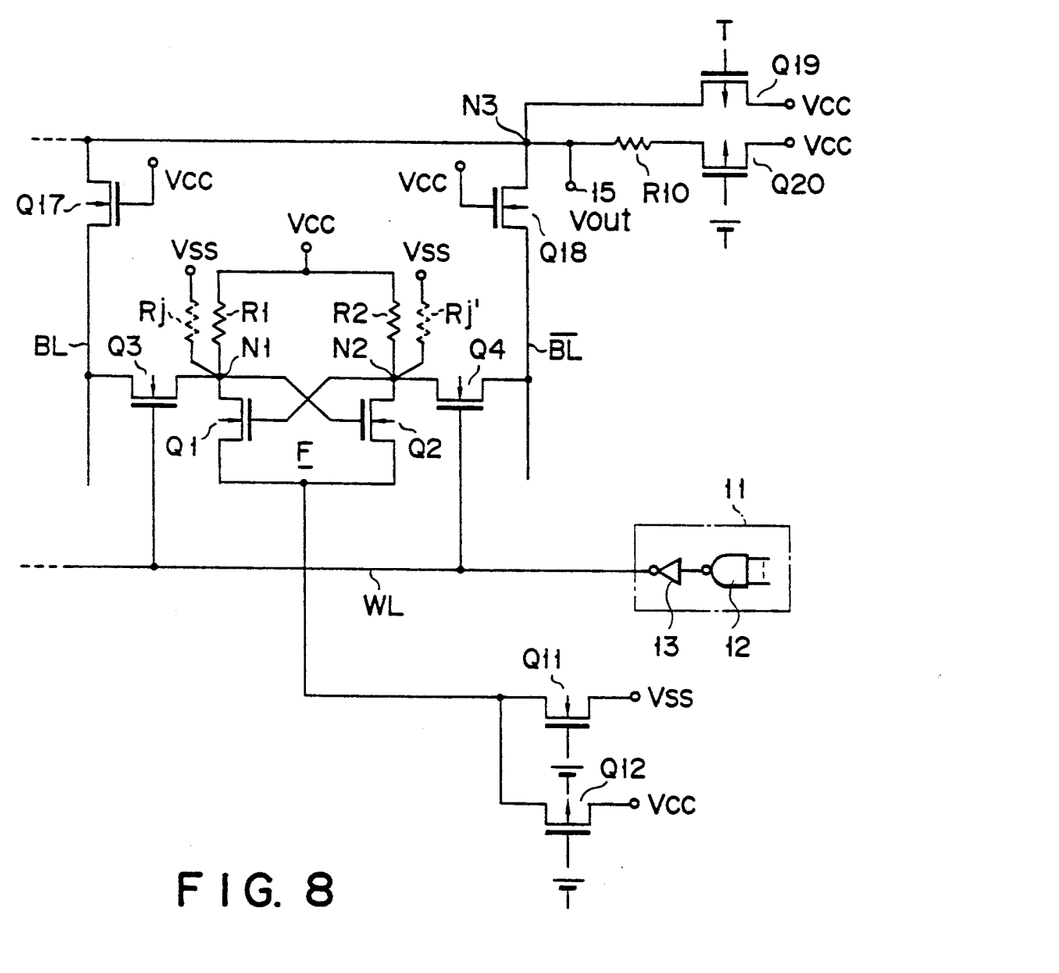
FIG. 8 is a circuit diagram illustrating the memory according to a second embodimen of this invention.

FIG. 8 is a circuit diagram illustrating the memory according to a second embodiment of the invention. The same elements as those shown in FIG. 7 are designated by the same reference numerals in FIG. 8, and will not be described in detail. Although this memory also has a number of memory cells and a number of bit-line pairs, each consisting of bit lines BL and $\overline{BL}$, only one cell and only one bit-line pair are shown in FIG. 8 for the sake of simplicity. As in the memory shown in FIG. 7, many memory cells are connected between bit lines BL and $\overline{BL}$ forming each pair. As is illustrated in FIG. 8, equivalent resistors Rj and Rj' are coupled to memory nodes N1 and N2 of the memory cell.

In the case of the memory shown in FIG. 7, the common source of transistors Q1 and Q2 of each memory cell is set to the "1" level, and all word lines WL are set to the "1" level, in order to test the memory to detect whether the memory contains a defective cell or cells. Even if the memory contains only one defective cell, it will be discarded. The memory cell shown in FIG. 8 has redundant cells (not shown) which can be connected to a word line. If the memory is found to have a defective cell, the word line to which the defective cell is replaced by the word line to which the redundant cells are coupled.

More specifically, as shown in FIG. 8, the common source of transistors Q1 and Q2 of each memory cell is connected to the common sources of the other transistors Q1 and Q2 of the other memory cells connected to the same word line WL. The common source of transistors Q1 and Q2 of each cell are connected to the source of the ground voltage $V_{SS}$ by N-channel MOS transistor Q11, and also to the source of the power-supply voltage $V_{CC}$ by P-channel MOS transistor Q12. N-channel MOS transistor Q11 receives at its gate control signal T which is set at the "0" level to test the memory cells. P-channel MOS transistor Q12 receives at its gate control signal $\overline{T}$ which is set at the "0" level to test the memory cells. The word line WL is connected to receive the data output by partial row decoder 11.

To test the memory (FIG. 8), the control signals T and $\overline{T}$ are set to the "1" level and the "0" level, respectively. As a result of this, transistors Q11 and Q12 of each memory cell are turned off and on, respectively, and the common source of transistors Q1 and Q2 is coupled to the source of the power-supply voltage $V_{CC}$. Then, only the one word line WL, which receives the output data of partial row decoder 11, which represents an address signal of an established logic value, is set at the "1" level. Hence, transistors Q3 and Q4, both connected to the one word line WL, are turned on. The voltage Vout at terminal 13 is responsive to only those memory cells connected to the one word line WL. Hence, the memory can be tested, in the unit of the cells connected to the same word line WL. Therefore, when a defective cell is detected, it suffices to replace the cells, including the defective cell, connected to a word line, with the memory cells etched to a redundant word line, thus saving the memory chip. However, it takes longer to test this memory than to test the memory shown in FIG. 7 since the test must be repeated a number of times equal to the number of word lines provided.

Figure 9A:
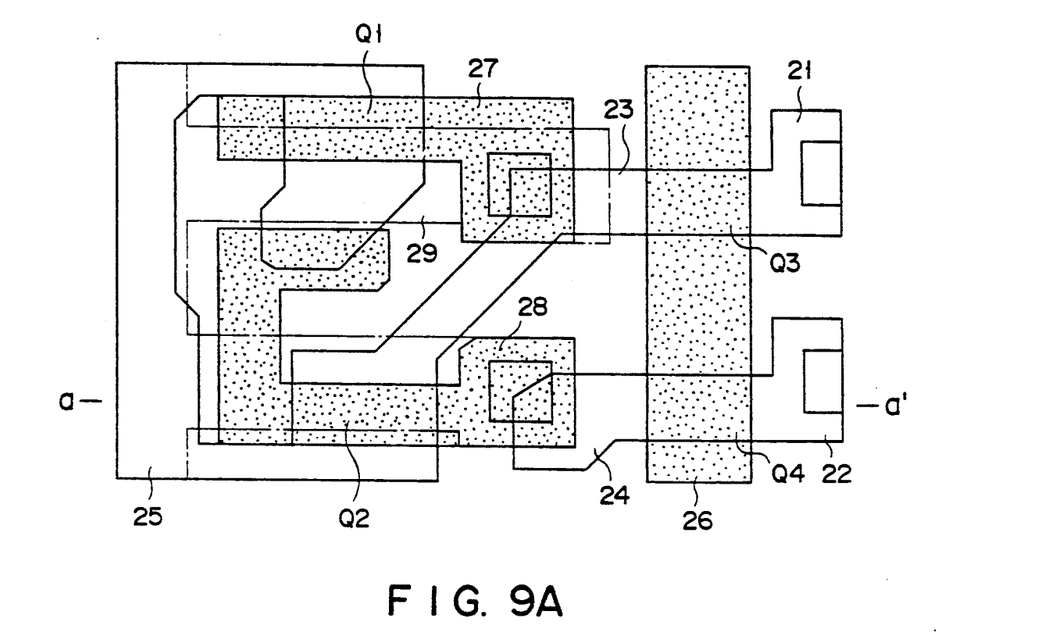
FIG. 9A is a plan view representing the element pattern in a portion of the E/R-type SRAM cell used in both the memory shown in FIG. 7 and the memory shown in FIG. 8.
Figure 9B:
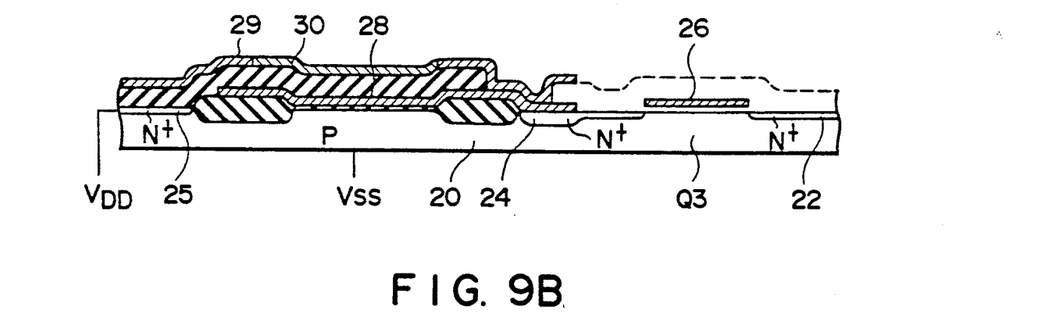
FIG. 9B is a cross-sectional view, taken along line a—a' in FIG. 9A.

FIG. 9A is a plane view representing the element pattern in a portion of the E/R-type SRAM cell used in both memories shown in FIGS. 7 and 8. FIG. 9B is a cross-sectional view, taken along line a—a' in FIG. 9A.

As is shown in FIGS. 9A and 9B, this memory cell has P-type well region 20. It further has N+ diffusion regions 21 and 22 which are either the drains or sources of transistors Q3 and Q4 connected to bit lines BL and $\overline{BL}$, N+ diffusion regions 23 and 24 which are either the sources or drains of transistors Q3 and Q4, and N+ diffusion region 25 which is the common source of transistors Q1 and Q2. The memory cell also has polycrystalline silicon layers 26, 27, 28, and 29. Layers 26, 27, and 28 are formed in a first plane, and layer 29 is formed in a second plane. Layer 26 is the gate electrodes of transistors Q3 and Q4; layer 27 is the gate electrode of transistor Q1; layer 28 is the gate electrode of transistor Q2; and layer 29 is used as high-resistance resistors R1 and R2 and a conductor. The portion 30 of layer 29 which functions as resistor R1 or R2 contains virtually no impurities, and has resistance of about $10^{12}$ Ω. The ground voltage $V_{SS}$ is always applied to P-type well region 20 which is the substrate on which the memory cells are formed. N+ diffusion region 25, which serves as the common source of transistors Q1 and Q2, is electrically isolated from well region 20, and the power-supply voltage VDD, which is determined by $V_{CC}$ and $V_{SS}$, is applied to N+ diffusion region 25.

As has been described above, the present invention can provide a static random access memory which has a circuit capable of detecting a leakage current, thereby to easily detect defective memory cells.

What is claimed is:

1. A static random access memory, comprising:
a plurality of memory cells each having a flip-flop circuit comprising two inverters, each inverter including a resistor functioning as a load element and a metal oxide semiconductor transistor having a source and a drain in a substrate, the sources of the MOS transistors in a memory cell being connected together and being electrically isolated from the substrate;
a plurality of word lines for selecting associated memory cells,
a plurality of bit lines for supplying data to and receiving data from, associated memory cells;
voltage-applying means for applying at least two different voltages to the sources of the MOS transistors of each memory cell; and
current-detecting means for detecting a leakage current flowing in each memory cell,
wherein the current-detecting means comprises a resistance element having a first end coupled to the bit lines, and a second end coupled to a power-supply voltage, the current detecting means further comprising a terminal for outputting a voltage equal to a voltage at the first end of the resistance element.

2. The static random access memory according to claim 1, wherein the sources of the MOS transistors of all memory cells are connected to each other.

3. The static random access memory according to claim 1, wherein the sources of the MOS transistors of all associated memory cells selected by the same word line of the plurality of word lines are connected in common to one another.

4. The static random access memory according to claim 1, wherein the voltage-applying means comprises a first switching element having first and second ends, the first end being connected to a node to which the power supply voltage is applied and the second end being connected to the sources of the MOS transistors of each memory cell, and a second switching element having first and second ends, the first end of the second switching element being connected to a node to which a ground voltage is applied and the second end of the second switching element being connected to the sources of the MOS transistors of each memory cell.

* * * * *